(12) United States Patent
Balakrishnan et al.

(10) Patent No.: US 10,297,512 B2
(45) Date of Patent: May 21, 2019

(54) METHOD OF MAKING THIN SRAM CELL HAVING VERTICAL TRANSISTORS

(71) Applicant: International Business Machines Corporation, Armonk, NY (US)

(72) Inventors: Karthik Balakrishnan, White Plains, NY (US); Michael A. Guillorn, Cold Spring, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/810,654

(22) Filed: Nov. 13, 2017

(65) Prior Publication Data
US 2018/0069013 A1   Mar. 8, 2018

Related U.S. Application Data

(62) Division of application No. 15/223,092, filed on Jul. 29, 2016.

(51) Int. Cl.
*H01L 21/336* (2006.01)
*H01L 21/8238* (2006.01)
(Continued)

(52) U.S. Cl.
CPC ...... *H01L 21/823885* (2013.01); *B82Y 10/00* (2013.01); *H01L 21/02603* (2013.01);
(Continued)

(58) Field of Classification Search
CPC ............. H01L 21/84; H01L 21/823885; H01L 21/02603; H01L 21/823871;
(Continued)

(56) References Cited

U.S. PATENT DOCUMENTS

| 8,373,235 B2* | 2/2013 | Masuoka | ............ H01L 27/0886 257/368 |
| 9,419,003 B1* | 8/2016 | Colinge | .............. H01L 27/1104 |

(Continued)

OTHER PUBLICATIONS

Trong Huynh-Bao, et al., "Design Technology Co-optimization for Enabling 5nm gate-all-around Nanowire 6T SRAM", IEEE, 2015 International Conference on IC Design & Technology (ICICDT), Jun. 1-3, 2015, 6 pgs.
(Continued)

*Primary Examiner* — Shouxiang Hu
(74) *Attorney, Agent, or Firm* — Harrington & Smith

(57) ABSTRACT

A memory device includes six field effect transistors (FETs) formed with semiconductor nanowires arranged on a substrate in an orientation substantially perpendicular to the substrate. The semiconductor nanowires have bottom contacts, gate contacts separated in a direction perpendicular to the substrate from the bottom contacts, and top contacts separated in a direction perpendicular to the substrate from the gate contacts. The necessary connections are made among the bottom, gate, and top contacts to form the memory device using first, second, and third metallization layers, the first metallization layer being separated in a direction perpendicular to the substrate from the top contacts, the second metallization layer being separated in a direction perpendicular to the substrate from the first metallization layer, and the third metallization layer being separated in a direction perpendicular to the substrate from the second metallization layer. Vias connect the various contacts to the overlying metallization layers as necessary. A method for forming the memory device is also outlined.

12 Claims, 11 Drawing Sheets

(51) Int. Cl.
| | |
|---|---|
| *H01L 27/11* | (2006.01) |
| *H01L 29/06* | (2006.01) |
| *H01L 27/06* | (2006.01) |
| *H01L 29/786* | (2006.01) |
| *H01L 21/84* | (2006.01) |
| *H01L 21/02* | (2006.01) |
| *B82Y 10/00* | (2011.01) |
| *H01L 29/417* | (2006.01) |
| *H01L 29/41* | (2006.01) |
| *H01L 29/775* | (2006.01) |

(52) U.S. Cl.
CPC .......... *H01L 21/84* (2013.01); *H01L 27/0688* (2013.01); *H01L 27/11* (2013.01); *H01L 27/1104* (2013.01); *H01L 27/1108* (2013.01); *H01L 29/0669* (2013.01); *H01L 29/0676* (2013.01); *H01L 29/413* (2013.01); *H01L 29/41741* (2013.01); *H01L 29/78642* (2013.01); *H01L 29/775* (2013.01)

(58) Field of Classification Search
CPC ............... H01L 27/1108; H01L 23/535; H01L 29/0676; H01L 27/1104; H01L 27/11; H01L 27/0688; H01L 29/78642; H01L 29/0669

See application file for complete search history.

(56) References Cited

U.S. PATENT DOCUMENTS

| | | | |
|---|---|---|---|
| 2010/0203714 A1* | 8/2010 | Masuoka | H01L 21/84 438/586 |
| 2010/0219482 A1* | 9/2010 | Masuoka | H01L 27/0207 257/369 |
| 2014/0312426 A1 | 10/2014 | Balakrishnan et al. | |
| 2014/0315363 A1 | 10/2014 | Balakrishnan et al. | |
| 2015/0303270 A1* | 10/2015 | Liaw | H01L 29/42392 257/9 |
| 2016/0172246 A1* | 6/2016 | van Dal | H01L 21/02532 438/268 |

OTHER PUBLICATIONS

"List of IBM Patents or Applications Treated as Related"; Nov. 2017; 1 pg.

* cited by examiner

METHOD OF MAKING THIN SRAM CELL HAVING VERTICAL TRANSISTORS

CROSS-REFERENCE TO RELATED APPLICATION

This application is a divisional of U.S. patent application Ser. No. 15/223,092, filed Jul. 29, 2016.

TECHNICAL FIELD

This disclosure relates to semiconductor nanowire field effect transistors and to memory devices formed therefrom.

BACKGROUND

The six transistor (6T) static random access memory (SRAM) cell is the primary memory used in microprocessor circuits. As is well known to those of ordinary skill in the art, continued efforts are being made to design integrated circuit chips having the greatest possible number of individual 6T SRAM cells, in order to provide the integrated circuit chip with as much memory as possible within the available area thereon. To achieve this goal, integrated circuit designers have been developing layouts for the transistors making up the cells to reduce the area required for each. The present invention provides one approach toward meeting this challenge.

SUMMARY

In one aspect of the present invention, a memory device comprises a first plurality of semiconductor nanowires for a first, a second, and a third field effect transistor (FET) and a second plurality of semiconductor nanowires for a fourth, a fifth, and a sixth FET. The first and second pluralities of semiconductor nanowires are arranged on a substrate with the semiconductor nanowires being oriented substantially perpendicular to the substrate.

The memory device further comprises a plurality of bottom contacts for the semiconductor nanowires on the substrate. Each of the semiconductor nanowires has a bottom contact. The one or more of the semiconductor nanowires of said first plurality for the third FET share a bottom contact with the one or more of the semiconductor nanowires of the second plurality for the fourth FET.

The memory device also comprises a plurality of gate contacts separated in a direction perpendicular to the substrate from the plurality of bottom contacts. Each of the semiconductor nanowires of the first and second pluralities has one of the gate contacts. Two or more semiconductor nanowires of the first plurality for the second and third FETs share a gate contact with one another, and two or more semiconductor nanowires of the second plurality for the fourth and fifth FETs share a gate contact with one another.

The memory device additionally comprises a first top contact for the first plurality of semiconductor nanowires, and a second top contact for the second plurality of semiconductor nanowires. The first and second top contacts are separated in a direction perpendicular to the substrate from said plurality of gate contacts.

As a consequence, the third and fourth FETs share a bottom contact; the second and third FETs share a gate contact; the fourth and fifth FETs share a gate contact; the first, second, and third FETs share a top contact; and the fourth, fifth, and sixth FETs share a top contact.

Finally, the gate contact of the second and third FETs is connected to the top contact of the fourth, fifth, and sixth FETs; the gate contact of the fourth and fifth FETs is connected to the top contact of the first, second, and third FETs; the gate contacts of the first and sixth FETs are connected to word line (WL) connections; the bottom contacts of the second and fifth FETs are connected to voltage source (Vdd) connections; the bottom contact of the first FET is connected to a second bit line (BLB) connection; the bottom contact of the sixth FET is connected to a first bit line (BL) connection; and the shared bottom contact of the third and fourth FETs is connected to a ground (Vss) connection.

In another aspect of the present invention, a method for forming a memory device comprises forming a first plurality of semiconductor nanowires for a first, a second, and a third field effect transistor (FET) and a second plurality of semiconductor nanowires for a fourth, a fifth, and a sixth FET on a substrate. The first and second pluralities of semiconductor nanowires are arranged with the semiconductor nanowires being oriented substantially perpendicular to the substrate.

The method for forming a memory device also comprises forming a plurality of bottom contacts for the semiconductor nanowires on the substrate. Each of the semiconductor nanowires has a bottom contact. The one or more of the semiconductor nanowires of the first plurality for the third FET share a bottom contact with the one or more of the semiconductor nanowires of the second plurality for the fourth FET.

The method for forming a memory device further comprises forming a plurality of gate contacts separated in a direction perpendicular to the substrate from the plurality of bottom contacts. Each of the semiconductor nanowires of the first and second pluralities has one of the gate contacts. Two or more semiconductor nanowires of the first plurality for the second and third FETs share a gate contact with one another, and two or more semiconductor nanowires of the second plurality for the fourth and fifth FETs share a gate contact with one another.

The method for forming a memory device additionally comprises forming a first top contact for the first plurality of semiconductor nanowires and a second top contact for the second plurality of semiconductor nanowires. The first and second top contacts are separated in a direction perpendicular to the substrate from the plurality of gate contacts.

As a consequence, the third and fourth FETs share a bottom contact; the second and third FETs share a gate contact; the fourth and fifth FETs share a gate contact; the first, second, and third FETs share a top contact; and the fourth, fifth, and sixth FETs share a top contact.

Finally, the method for forming a memory device further comprises connecting the gate contact of the second and third FETs to the top contact of the fourth, fifth, and sixth FETs; connecting the gate contact of the fourth and fifth FETs to the top contact of the first, second, and third FETs; connecting the gate contacts of the first and sixth FETs to word line (WL) connections; connecting the bottom contacts of the second and fifth FETs to voltage source (Vdd) connections; connecting the bottom contact of the first FET to a second bit line (BLB) connection; connecting the bottom contact of the sixth FET to a first bit line (BL) connection; and connecting the shared bottom contact of the third and fourth FETs to a ground (Vss) connection.

BRIEF DESCRIPTION OF THE DRAWINGS

The foregoing and other aspects of these teachings are made more evident in the following detailed description, when read in conjunction with the attached drawing figures.

DETAILED DESCRIPTION

An integrated circuit may include a number of different types of field effect transistor (FET) devices that may be formed from nanowire channel FETs. A nanowire channel FET includes a silicon nanowire that connects to a source region and a drain region and a gate that fully (or partially) surrounds the nanowire or nanowires. The channel forms at the surface of the nanowires under the gate, or in the bulk of the nanowires for nanowires with diameter smaller than about 5 nm. When the gate fully surrounds the nanowire, the device is referred to as a gate-all-around (GAA) FET. When the gate partially surrounds the nanowire, as in the case where the nanowire is attached to an insulator, the device is referred to as an omega-gate FET.

Nanowire FETs may be fabricated to form, for example, nFET and pFET devices. The nFET and pFET devices may be connected to form a variety of integrated circuit devices such as, for example, inverters and static random access memory (SRAM) cells. It is generally desirable in circuit devices for FETs to be matched by having, for example, similar threshold voltages and drive current.

In general, nano wire FET devices that are formed on a wafer may include any number of nanowires. The fabrication process may include, for example, forming a silicon nanowire on a buried oxide (BOX) substrate using an isotropic etching process. The etching process results in an elliptically (including cylindrically) shaped nanowire that may be suspended above the substrate or may be partially disposed on the substrate. A metallic or polysilicon gate structure is formed on the nanowire. Source and drain regions are formed adjacent to the gate structure, and contacts may be formed to connect the source, drain, and gate structure to other devices.

The fabrication process may result in particular nanowires having different properties such as, for example, the diameter of one nanowire on a wafer may be different from the diameter of another nanowire due to the location of the particular nanowire on the wafer. Though the diameters of two different nanowires may vary on a wafer, the diameter of each particular nanowire is typically constant, and within a desired tolerance.

Integrated circuit components, such as, for example, SRAM cells and inverters, include a number of pFET and nFET devices disposed on nanowires that are arranged on a wafer. Since the properties of the nanowires (e.g., nanowire diameters) affect the operation of the devices, it is desirable to arrange the devices such that the effects of the differences in the nanowire properties are reduced.

Figure 1:
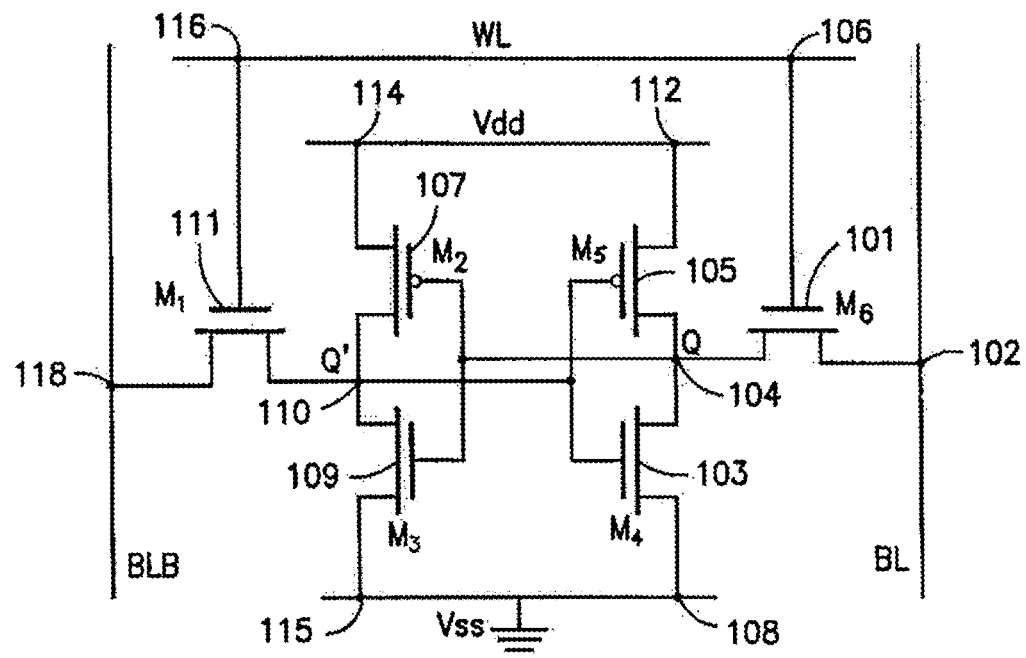
FIG. 1 is a circuit diagram of a static random access memory (SRAM).

FIG. 1 is a circuit diagram of a static random access memory (SRAM). The SRAM includes an nFET device ($M_6$) 101 connected to a first bit line node (BL) 102, a first output node (Q) 104, and a word line node (WL) 106. An nFET device ($M_4$) 103 is connected to the Q node 104, a ground node (Vss) 108, and a second output node (Q') 110. A pFET device ($M_5$) 105 is connected to the Q node 104, the Q' node 110, and a voltage source node (Vdd) 112. A pFET device ($M_2$) 107 is connected to the Vdd node 114, the Q node 104, and the Q' node 110. An nFET device ($M_3$) 109 is connected to the Vss node 115, the Q node 104, and the Q' node 110. An nFET device ($M_1$) 111 is connected to a second bit line node (BLB) 118, the WL node 116, and the Q' node 110. The nFET devices, $M_1$ and $M_6$, respectively, are the pass-gate (PG) transistors of the SRAM; the nFET devices, $M_3$ and $M_4$, respectively, are the pull-down (PD) transistors of the SRAM; and the pFET devices, $M_2$ and $M_5$, respectively, are the pull-up (PU) transistors of the SRAM.

Figure 2:
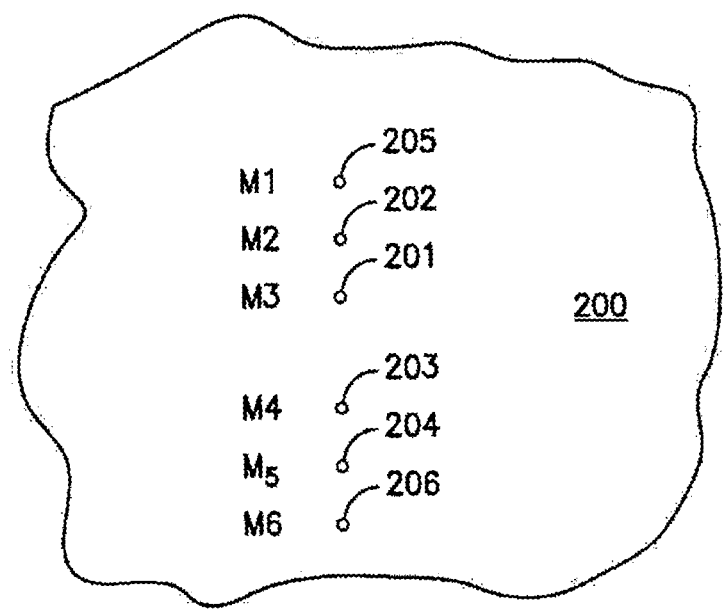
FIG. 2 is a plan view taken in an axial direction of nanowires useful in the practice of the present invention.

In the present invention, nanowires which are used to provide FETs for inverters and SRAM cells are oriented perpendicularly to the surface of the silicon wafers on which they are formed. Reference is now made to FIG. 2, which is a plan view taken in an axial direction of the nanowires from a vantage point perpendicularly displaced from the silicon wafer 200 on which the nanowires are formed and illustrating an arrangement of such nanowires useful in the practice of the present invention. As such, the nanowires are shown as circles since they are being viewed end on. It will be noted that the nanowires are labelled $M_1$ through $M_6$, so that reference may be made to the circuit diagram in FIG. 1 from time to time in the discussion to follow. So, nanowires 201 to 206 are used in the manufacture of FETs $M_1$ through $M_6$, respectively, and are doped as necessary to produce pFETs ($M_2$, $M_5$) and nFETs ($M_1$, $M_3$, $M_4$, $M_6$). It should be understood that the nanowires 201 to 206 are gradually built up to their intended height (length) upward from the silicon wafer 200 in the course of this manufacture.

Figure 3:
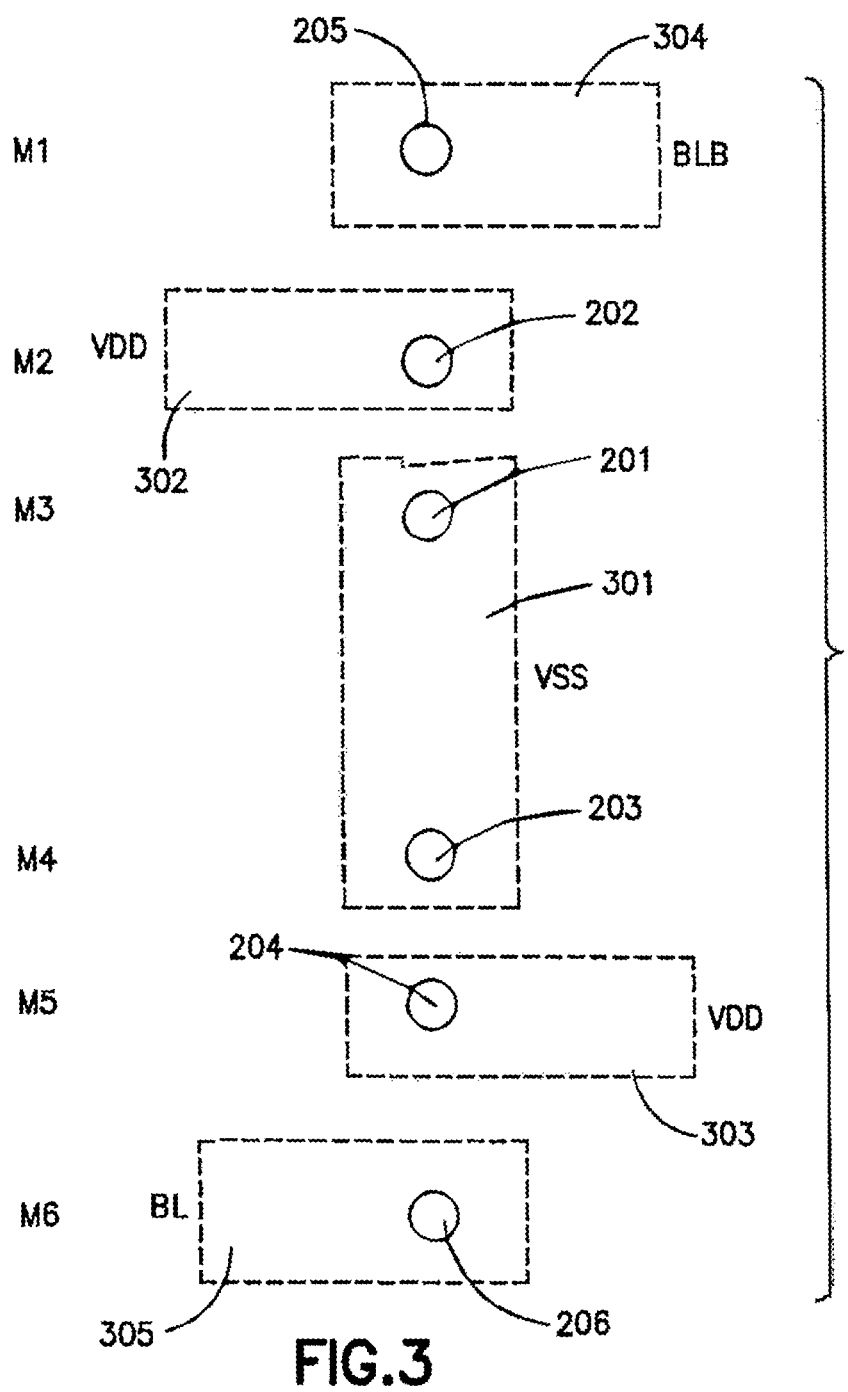
FIG. 3 illustrates the bottom contacts for the nanowires of FIG. 1.

The FETs are assembled in layers on the silicon wafer 200. The bottommost layer (layer 1) is shown in FIG. 3, taken, as are all subsequent views, from the same vantage point as was FIG. 2. FIG. 3 illustrates the bottom contacts for nanowires 201 to 206. It will be noted that nanowires 201, 203 for nFETs $M_3$, $M_4$, respectively, share a bottom contact 301 with Vss as suggested in the circuit diagram in FIG. 1. Further, nanowires 202, 204 for pFETs $M_2$, $M_5$, respectively, have bottom contacts 302, 303, respectively, with Vdd as suggested in the circuit diagram in FIG. 1. Finally, nanowire 205 for nFET $M_1$ has a bottom contact 304 with the second bit line node (BLB), and nanowire 206 for nFET $M_6$ has a bottom contact 305 with the first bit line node (BL), both as suggested in the circuit diagram in FIG. 1. It should be understood that, while nanowires 201 to 206 are shown by themselves in FIG. 2 for purposes of illustration, they may be disposed upstanding on their respective bottom contacts or set within and projecting upward from them so that their bottom ends are surrounded by the material thereof.

Figure 4:
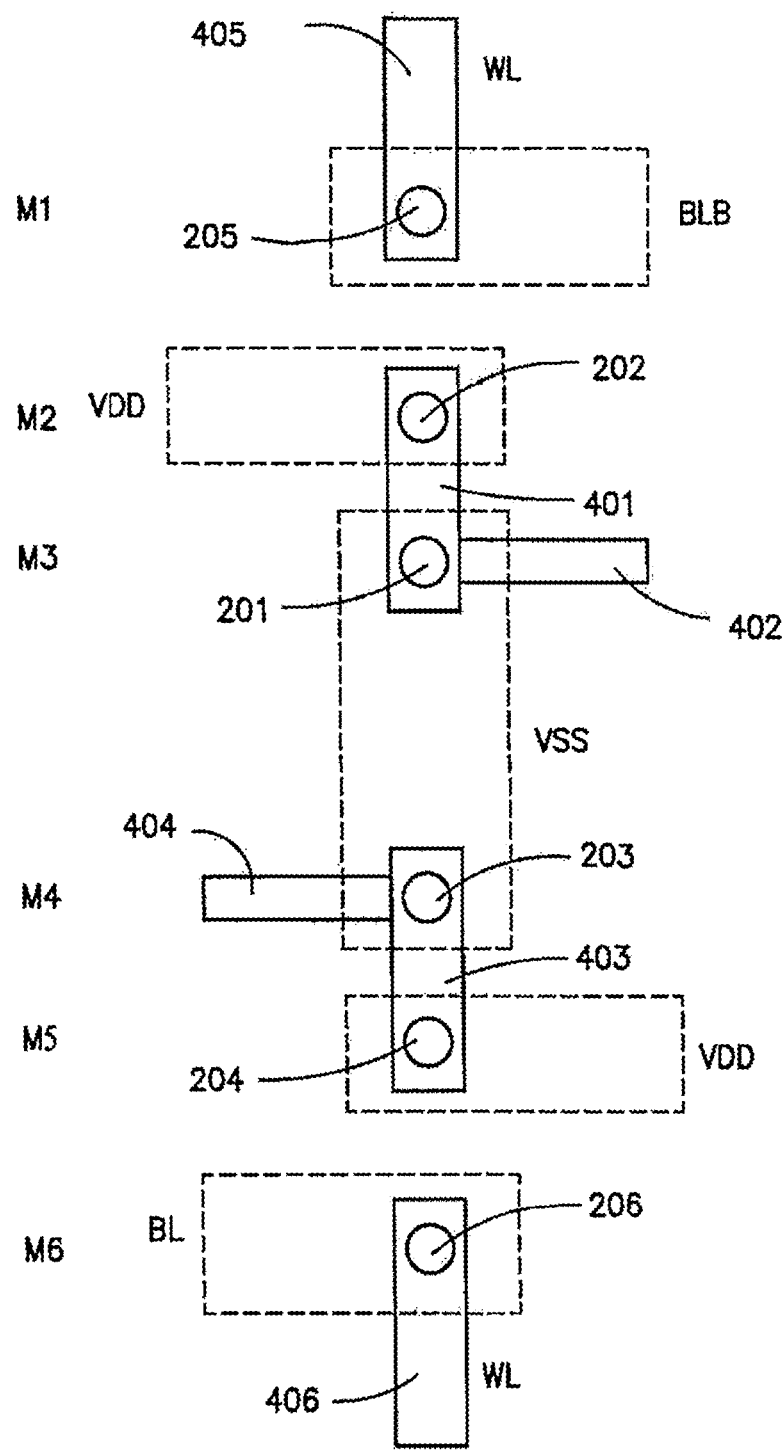
FIG. 4 illustrates the gate patterning for the nanowires of FIG. 1.

The next layer (layer 2) above the bottommost layer is shown in solid lines in FIG. 4, which illustrates the gate patterning for FETs $M_1$ to $M_6$. Layer 2, it is to be understood, is vertically separated, or, more specifically, separated in a direction perpendicular to the silicon wafer 200, from the bottommost layer (layer 1). Gate contact 401 surrounds nanowires 201, 202 for nFET $M_3$ and pFET $M_2$, respectively, as suggested by the circuit diagram in FIG. 1, where the gates for $M_3$ and $M_2$ are connected to one another. Gate contact 401 has a gate extension 402, whose purpose will be given below. Similarly, gate contact 403 surrounds nanowires 203, 204 for nFET $M_4$ and pFET $M_5$, respectively, as suggested by the circuit diagram in FIG. 1, where the gates for $M_4$ and $M_5$ are connected to one another. Gate contact 403 has a gate extension 404, whose purpose will also be given below. Gate contacts 405, 406 surround nanowires 205, 206, respectively, for nFETs $M_1$ and $M_6$, both ultimately to be attached to the word line (WL), as suggested by the circuit diagram in FIG. 1.

Figure 5:
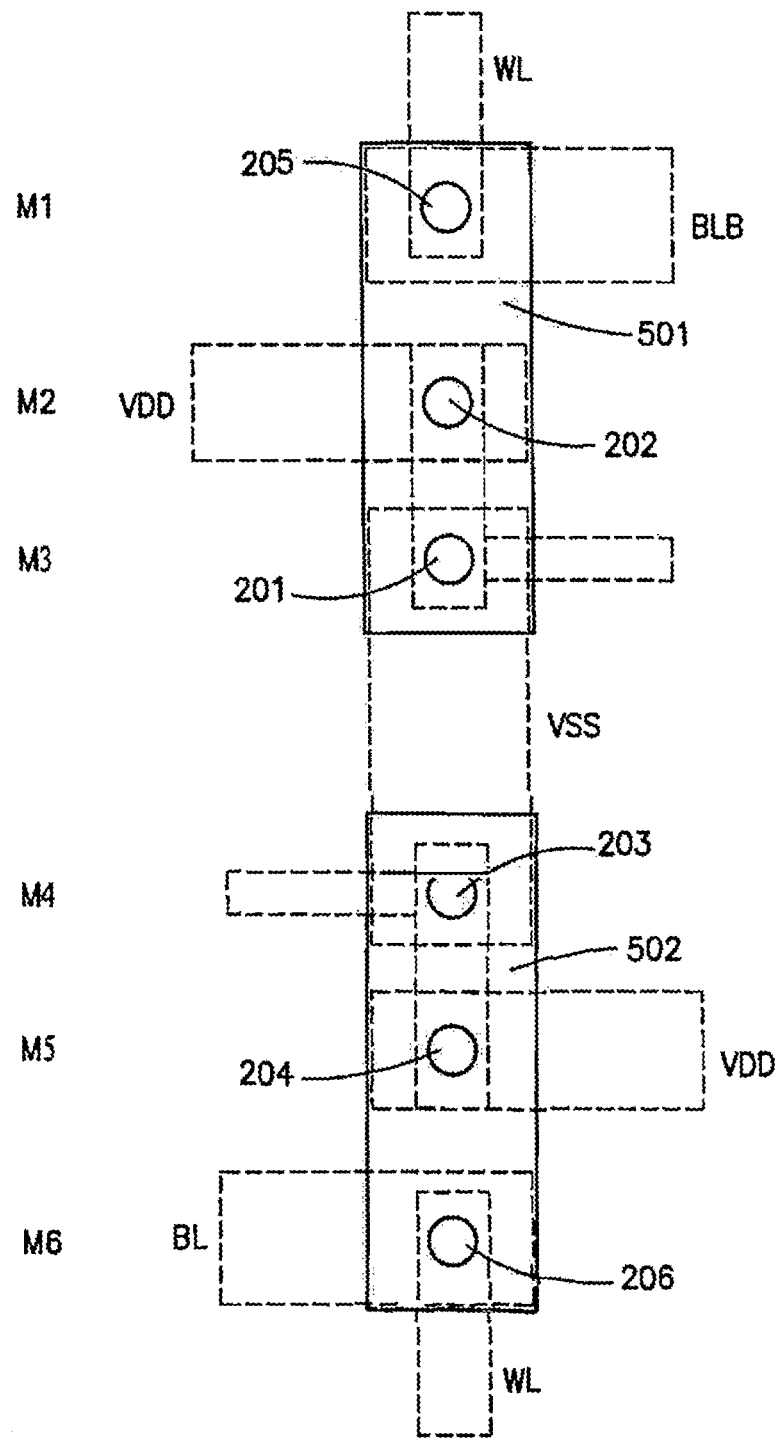
FIG. 5 illustrates the top contacts for the nanowires of FIG. 1.

The next layer (layer 3) above the gate patterning layer (layer 2) is shown in solid lines in FIG. 5, which illustrates the top contacts for nanowires 201 to 206. Layer 3, it is to be understood, is vertically separated, or, more specifically, separated in a direction perpendicular to the silicon wafer 200, from the gate patterning layer (layer 2). It will be noted that nanowires 201, 202, 205 for nFET $M_3$, pFET $M_2$, and nFET $M_1$, respectively, share a top contact 501; nFET $M_3$, pFET $M_2$, and nFET $M_1$ are all connected to one another as shown in the circuit diagram in FIG. 1. Further, nanowires 203, 204, 206 for nFET $M_4$, pFET $M_5$, and nFET $M_6$, respectively, share a top contact 502; nFET $M_4$, pFET $M_5$, and nFET $M_6$ are likewise all connected to one another as shown in the circuit diagram in FIG. 1. Although nanowires 201 to 206 are visible in FIG. 5 for purposes of illustration, the top contacts 501, 502 cover their respective top ends.

It will be recalled that nFETs $M_3$ and $M_4$ are referred to as pull-down (PD) transistors; that nFETs $M_1$ and $M_6$ are referred to as pass-gate (PG) transistors; and that pFETs $M_2$ and $M_5$ are referred to as pull-up (PU) transistors. The partially assembled SRAM cell shown in FIG. 5 may be described as having a pull-up/pass-gate/pull-down (PU-PG-PD) ratio of 1-1-1, meaning that each of the transistors is being constructed using one nanowire. Cells having other ratios may be constructed, and the use of different numbers of nanowires to form the transistors provides a good way to ratio the transistors making up a SRAM cell.

Figure 6:
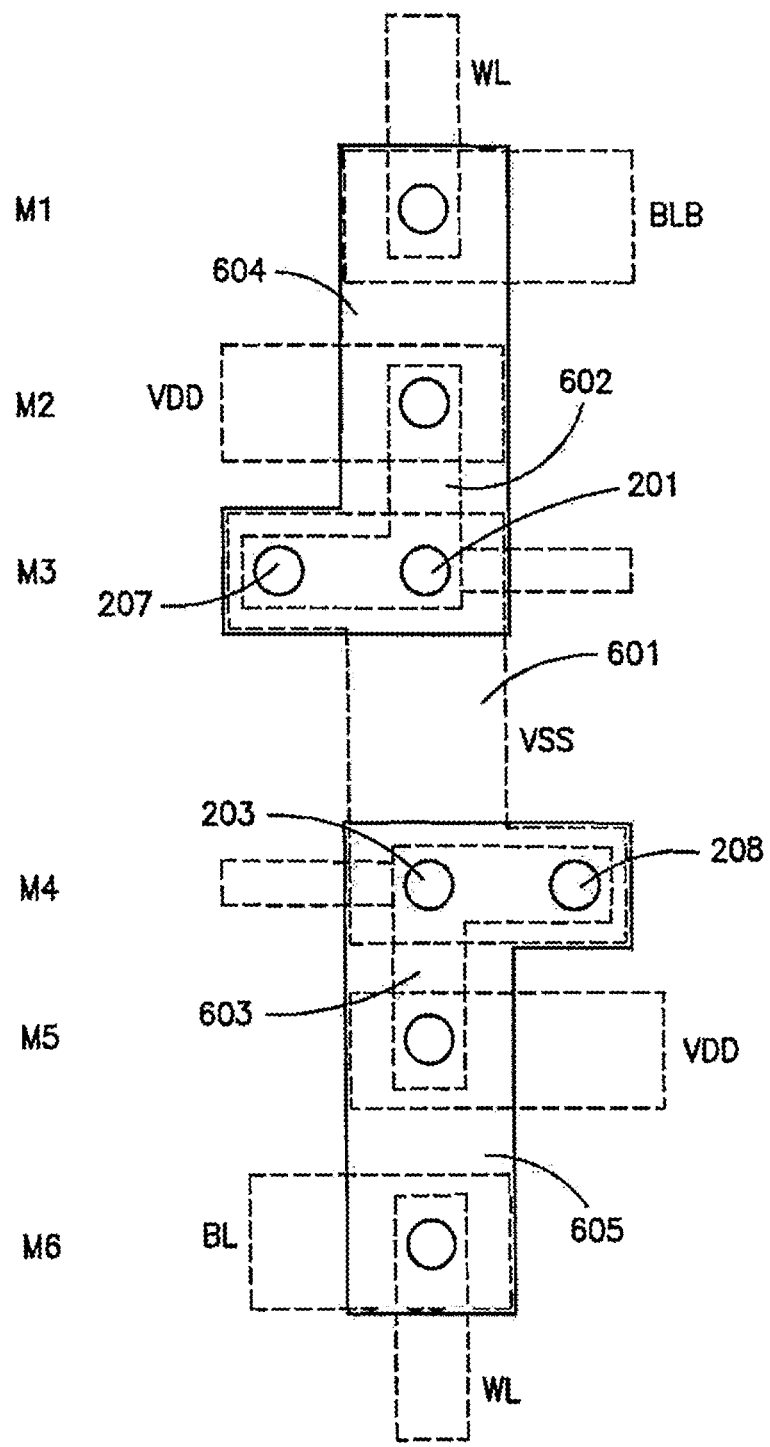
FIG. 6 shows the bottom contacts, the gate patterning, and the top contacts for nanowires in a first alternate embodiment of the invention.

For example, FIG. 6 shows a partially assembled SRAM cell having a PU-PG-PD ratio of 1-1-2 in which pull-down (PD) transistors $M_3$ and $M_4$ are both constructed using two nanowires. Specifically, nFET $M_3$ has a second nanowire 207, and nFET $M_4$ has a second nanowire 208. It is necessary, in order to provide the necessary bottom contacts for the additional nanowires 207, 208, that bottom contact 601 be extended at each end, namely, to the left for nanowire 207 and to the right for nanowire 208, compared to bottom contact 301 of FIG. 3, to contact nanowires 207, 208 in addition to nanowires 201, 203.

Similarly, gate contacts 602, 603 are extended, compared to gate contacts 401, 403 of FIG. 4, to surround nanowires 207, 208 in addition to nanowires 201, 203, respectively. Finally, top contacts 604, 605 are extended, compared to top 501, 502 of FIG. 5, to contact nanowires 207, 208 in addition to nanowires 201, 203.

Figure 7:
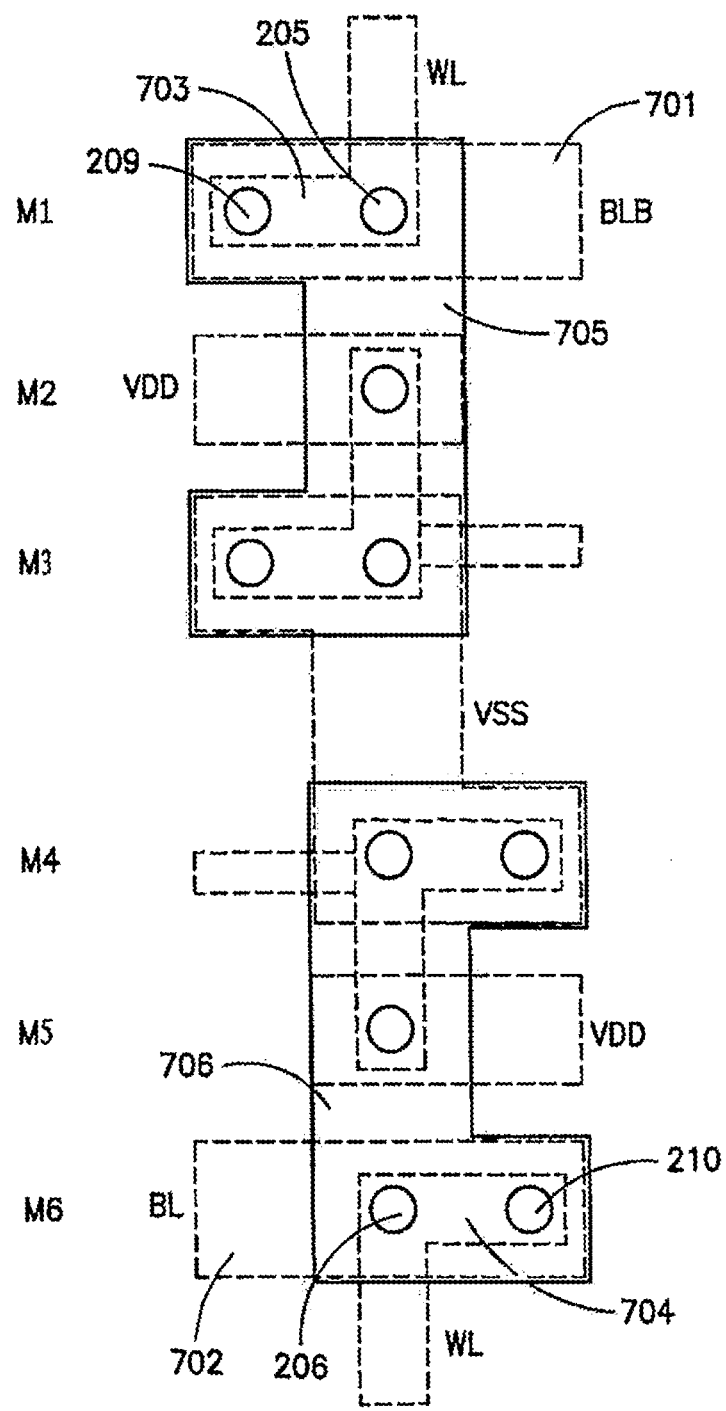
FIG. 7 shows the bottom contacts, the gate patterning, and the top contacts for nanowires in a second alternate embodiment of the invention.

As an additional example, FIG. 7 shows a partially assembled SRAM cell having a PU-PG-PD ratio of 1-2-2 in which pull-down (PD) transistors $M_3$ and $M_4$ are both constructed from two nanowires, and pass-gate (PG) transistors $M_1$ and $M_6$ are both constructed from two nanowires. In addition to the details provided above for FIG. 6, nFET $M_1$ has a second nanowire 209, and nFET $M_6$ has a second nanowire 210. In order to provide the necessary bottom contacts for the additional nanowires 209, 210, bottom contact 701 is extended, compared to bottom contact 304 of FIG. 3, to the left to contact nanowire 209 in addition to nanowire 205, and bottom contact 702 is extended to the right, compared to bottom contact 305 of FIG. 3, to contact nanowire 210 in addition to nanowire 206.

Similarly, gate contacts 703, 704 are extended, compared to gate structures 405, 406 of FIG. 4, to surround nanowires 209, 210 in addition to nanowires 205, 206, respectively. Finally, top contacts 705, 706 are extended, compared to top contacts 604, 605 of FIG. 6, to contact nanowires 209, 210 in addition to nanowires 201, 202, 205, 207 and 203, 204, 206, 208, respectively.

Figure 8:
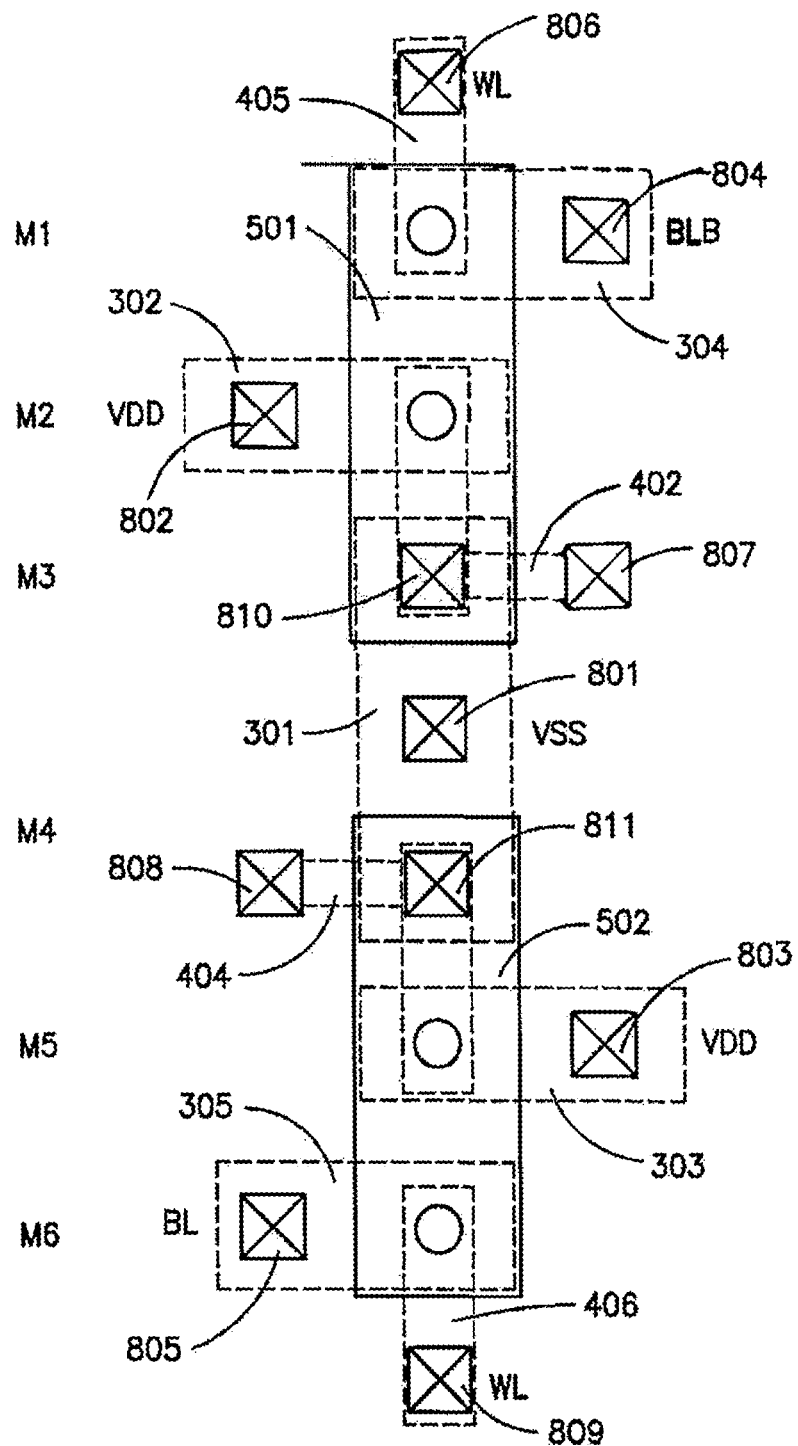
FIG. 8 is a plan view of the vias for connecting the bottom contacts, the gate contacts, and the top contacts for the embodiment of FIG. 5 to the first metallization layer.

Returning now to the embodiment having a PU-PG-PD ratio of 1-1-1 shown in FIG. 5, the next layer (layer 4) to be formed above the top contacts 501, 502 is a first metallization layer. However, it is first necessary to provide vias for connecting bottom contacts 301, 302, 303, 304, 305; gate contacts 401, 403, 405, 406; and top contacts 501, 502 to the first metallization layer. The vias connecting these contacts to the first metallization layer are collectively referred to as Via0. Referring to FIG. 8, bottom vias 801, 802, 803, 804, 805 are provided on source-side contacts 301, 302, 303, 304, 305, respectively, and extend more or less perpendicularly therefrom in a direction parallel to the nanowires 201, 202, 203, 204, 205, 206.

Similarly, gate vias 806, 807, 808, 809 are provided on gate contact 405, gate extensions 402, 404, and gate contact 406, respectively, and extend more or less perpendicularly therefrom in a direction parallel to the nanowires 201, 202, 203, 204, 205, 206. Finally, top vias 810, 811 are provided on top contacts 501, 502, respectively, and also extend more or less perpendicularly therefrom in a direction parallel to the nanowires 201, 202, 203, 204, 205, 206.

Bottom vias 801, 802, 803, 804, 805; gate vias 806, 807, 808, 809; and top vias 810, 811, collectively Via0, extend above the top contact layer (layer 3) shown in FIG. 5 to a first metallization layer (layer 4) in a plane separated from top contacts 501, 502. In other words, layer 4 is vertically separated, or, more specifically, separated in a direction perpendicular to the silicon wafer 200, from the top contact layer (layer 3).

Figure 9:
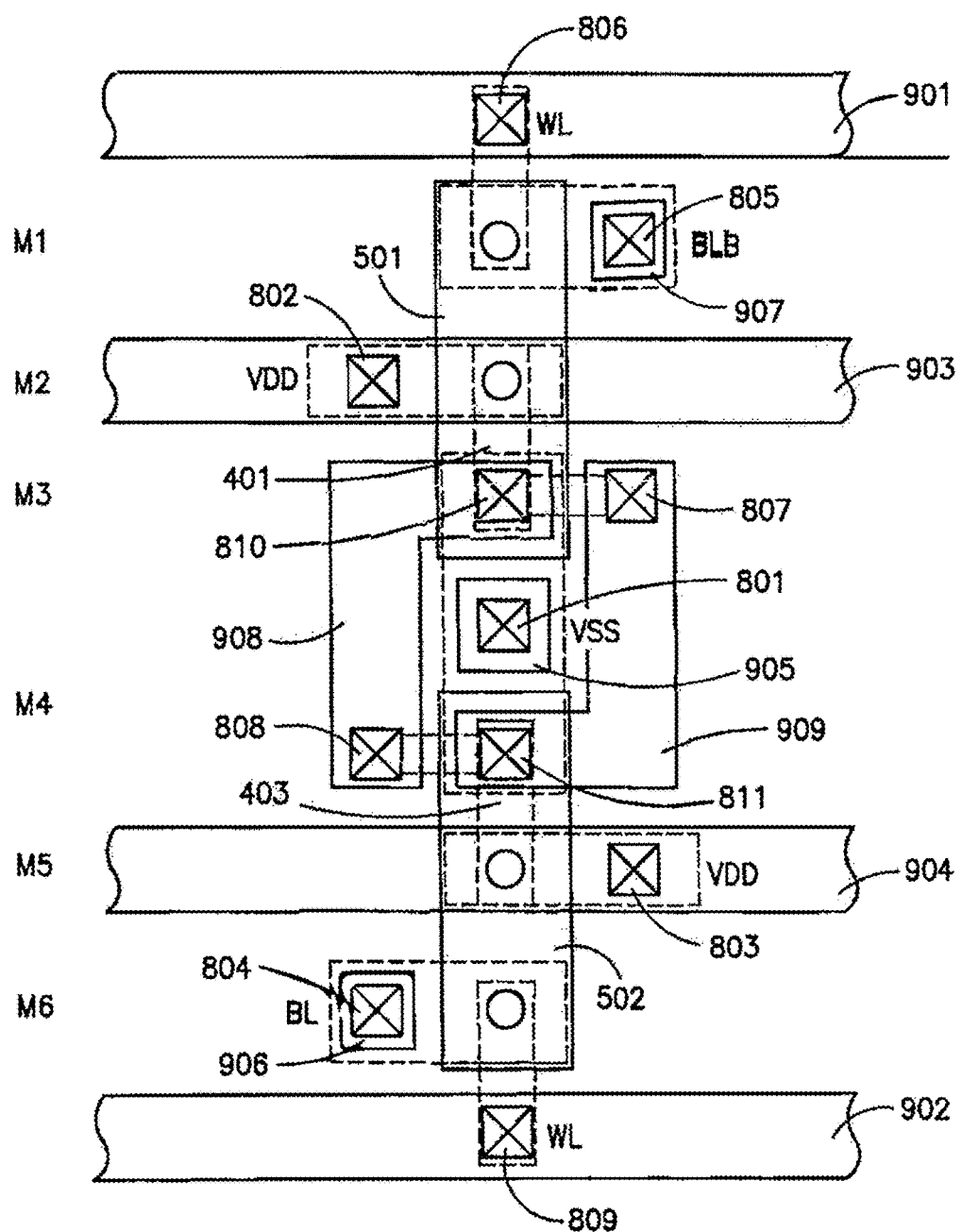
FIG. 9 is a plan view of the first metallization layer.

Reference is now made to FIG. 9, where the first metallization layer (layer 4) is shown to include strips of metallic conductor deposited onto the structure shown in FIG. 8 to form some of the necessary electrical connections for a cell. Strips 901, 902, providing connections to a word line (WL) node, make electrical contact with gate vias 806, 809, respectively, for nFETs $M_1$ and $M_6$, in accordance with the circuit diagram in FIG. 1. Strips 903, 904, providing connections to a voltage source node (Vdd), make electrical contact with bottom vias 802, 803, respectively, for pFETs $M_2$ and $M_5$, in accordance with the circuit diagram in FIG. 1. Strips 901 to 904 may continue to the left and to the right to provide the same connections for SRAM cells to the left and right of that being illustrated in FIG. 9.

The first metallization layer (layer 4) also includes strips 905, 906, 907 of metallic conductor, which make electrical contact with bottom vias 801, 804, 805, respectively. These will ultimately provide connections to a ground node (Vss), to a first bit line node (BL), and to a second bit line node (BLB), respectively, using second and third metallization layers to be described below. In this regard, ground node (Vss) will ultimately be connected to the bottom contact 301 for nFETs $M_3$ and $M_4$; first bit line node (BL) will ultimately be connected to the bottom contact 305 for nFET $M_6$; and second bit line node (BLB) will ultimately be connected to the bottom contact 304 for nFET $M_1$, all in accordance with the circuit diagram in FIG. 1.

The first metallization layer (layer 4) finally includes L-shaped strips 908, 909 of metallic conductor. L-shaped strip 908 connects gate via 808 to top via 810, whereby the gate contact 403 for nFET $M_4$ and pFET $M_5$ is connected to the top contact 501 for nFET $M_3$, pFET $M_2$, and nFET $M_1$, in accordance with the circuit diagram in FIG. 1. Similarly, L-shaped strip 909 connects gate via 807 to top via 811, whereby the gate contact 401 for nFET $M_3$ and pFET $M_2$ is connected to the top contact 502 for nFET $M_4$, pFET $M_5$, and nFET $M_6$.

Still referring to FIG. 9, subsequent to the deposition of strips of metallic conductor 901 to 909, vias, collectively referred to as Via1, extend above the first metallization layer (layer 4) from strips 905, 906, 907 of metallic conductor to a second metallization layer (layer 5) in a plane separated from strips 901 to 909. In other words, the second metallization layer (layer 5) is vertically separated, or, more specifically, separated in a direction perpendicular to the silicon wafer 200, from the first metallization layer (layer 4).

Figure 10:
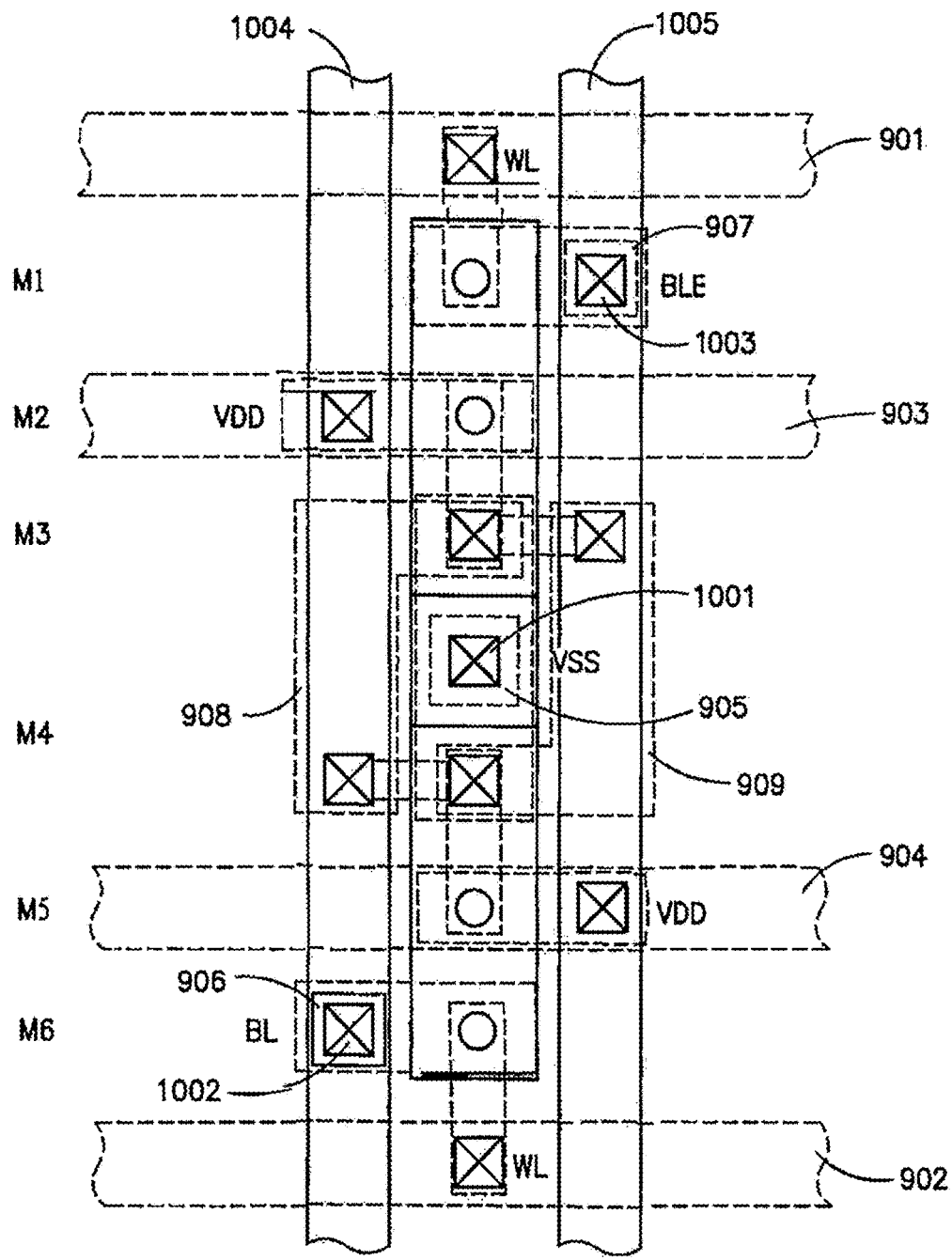
FIG. 10 is a plan view of the second metallization layer.

Turning now to FIG. 10, vias 1001, 1002, 1003, collectively Via1, extend upward from strips 905, 906, 907 of metallic conductor to a second metallization layer (layer 5) in a plane separated from strips 901 to 909. The second metallization layer (layer 5) comprises strips 1004, 1005 of metallic conductor. Strips 1004, 1005, providing connections to a first bit line node (BL) and a second bit line node (BLB), respectively, make electrical contact with vias 1002, 1003, respectively, which, in turn, make electrical contact with bottom vias 804, 805 for nFETs $M_6$ and $M_1$, in accordance with the circuit diagram in FIG. 1.

Still referring to FIG. 10, subsequent to the deposition of strips 1004, 1005 of metallic conductor, a via, which may also be referred to as Via2, extends above the second metallization layer (layer 5) from via 1001 to a third metallization layer (layer 6) in a plane separated from strips 1004, 1005. In other words, the third metallization layer (layer 6) is vertically separated, or, more specifically, separated in a direction perpendicular to the silicon wafer 200, from the second metallization layer (layer 5).

Figure 11:
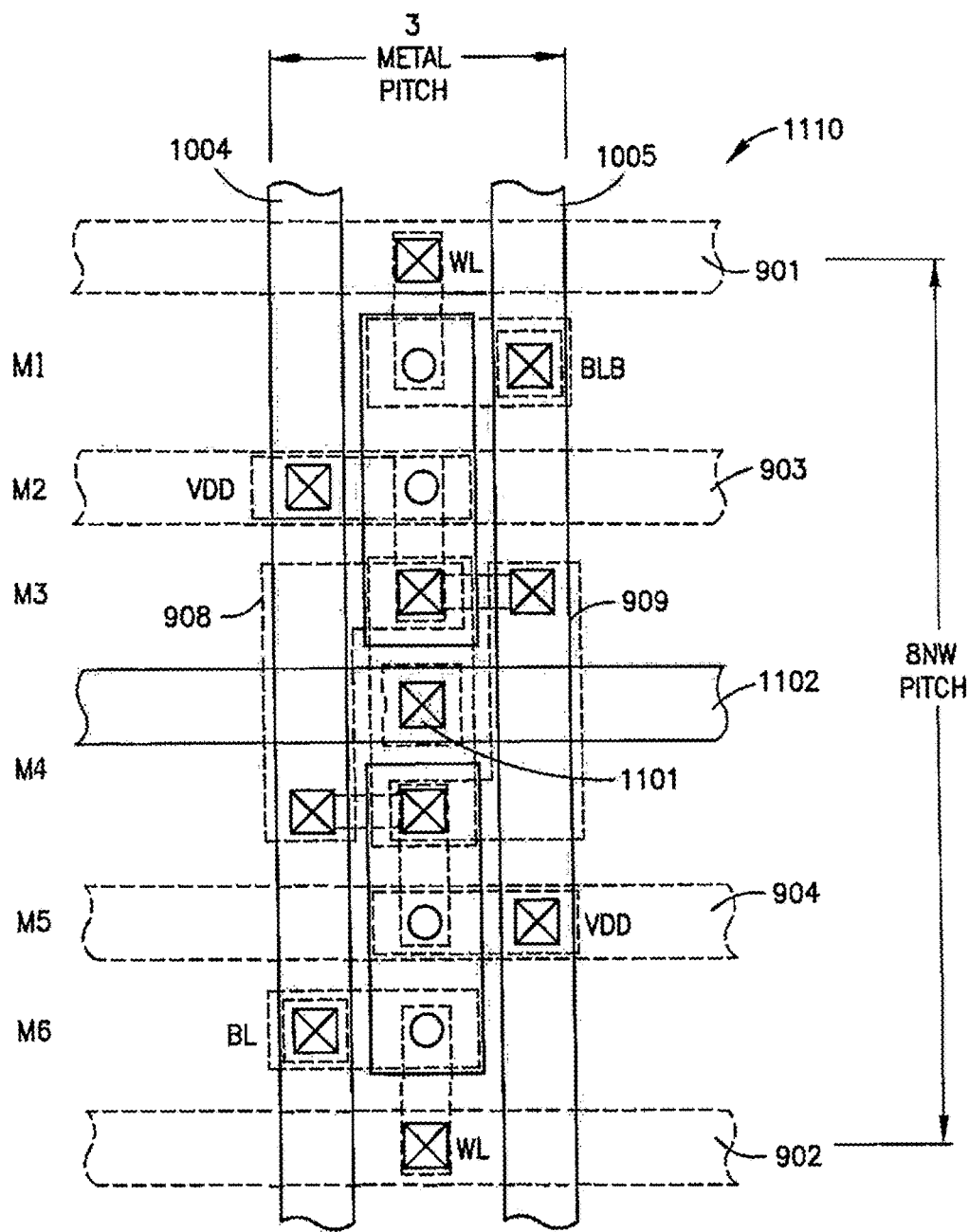
FIG. 11 is a plan view of the third metallization layer.

Turning now to FIG. 11, via 1101, otherwise known as Via2, extends upward from via 1001 to a third metallization layer (layer 6) in a plane separated from strips 1004, 1005. The third metallization layer (layer 6) comprises strip 1102 of metallic conductor. Strip 1102, providing a connection to a ground node (Vss), makes electrical contact with via 1001, which, in turn, makes electrical contact with bottom via 801 for nFETs $M_3$ and $M_4$, in accordance with the circuit diagram in FIG. 1.

This completes the description of a single SRAM cell 1010 assembled in accordance with the present invention. It should be observed that the height of the SRAM cell 1110, the height being in the vertical direction in FIG. 11, is eight times the distances separating the nanowires from one another, the latter being referred to as the nanowire pitch. The width of the SRAM cell 1110, the width being in the horizontal direction in FIG. 11, is three times the metal pitch, the latter being the distance separating adjacent strips of metallic conductor in the second metallization layer (layer 5) to be more clearly shown in FIG. 12. When the nanowire pitch is 18 nanometers (nm), and the metal pitch is 24 nm, the area of a single SRAM cell 1110 is 0.0104 $\mu m^2$.

Referring back to FIGS. 6 and 7, which show partially assembled SRAM cells having PU-PG-PD ratios of 1-1-2 and 1-2-2, respectively, it will be recognized that the areas of SRAM cells of those types will be the same as that of the 1-1-1 SRAM cell 1110 shown in FIG. 11. That is because the additional nanowires required for the production of such cells will not extend beyond the area of the SRAM cell 1110 as shown, as they will be located below (underneath) the strips 1004, 1005 of metallic conductor.

Figure 12:
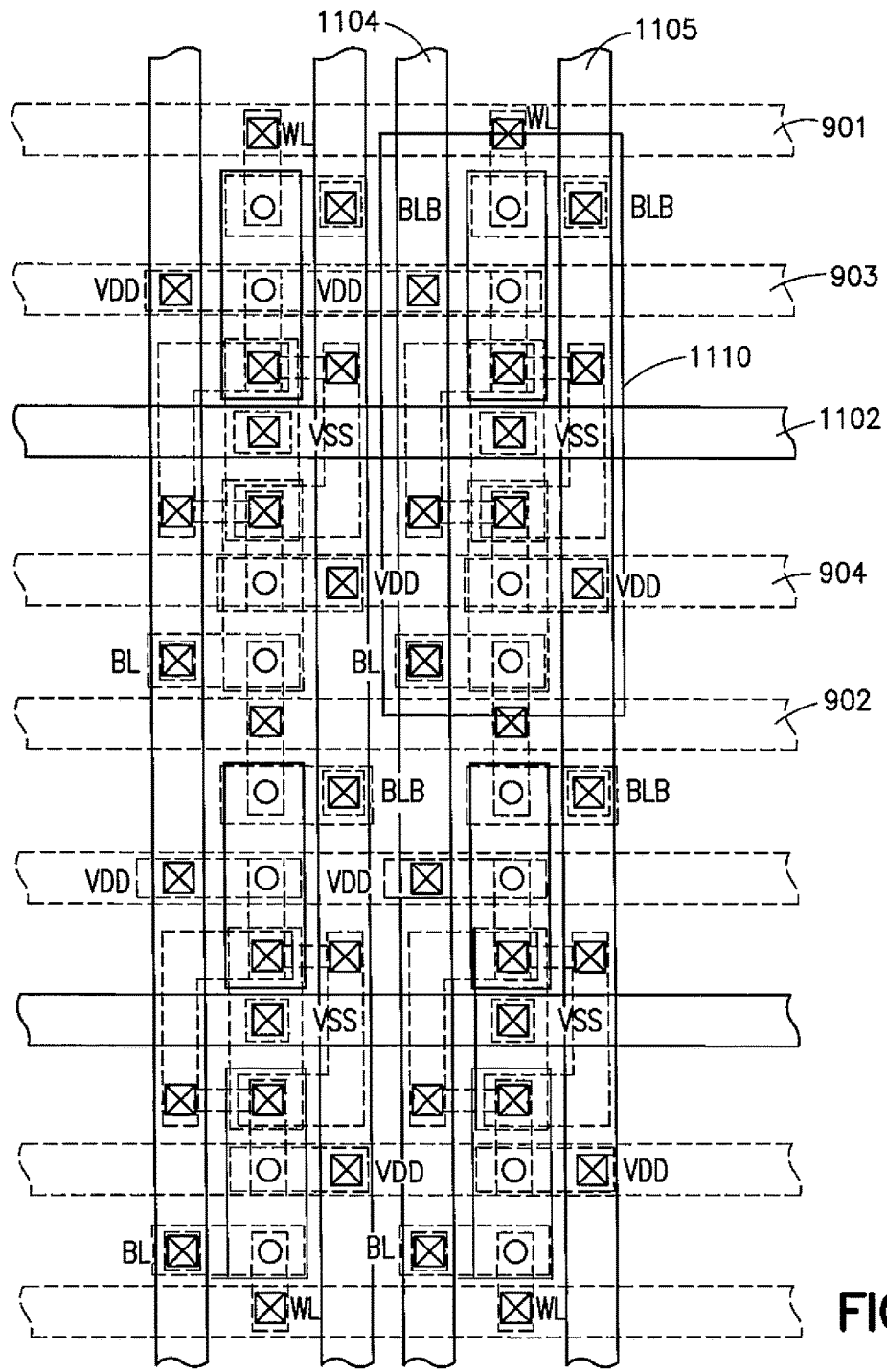
FIG. 12 shows the location of a SRAM cell of the present invention relative to its neighbors of the same type in the vertical and horizontal directions.

Turning now to FIG. 12, the location of SRAM cell 1110 relative to its neighbors in the vertical and horizontal directions is shown. It will be readily apparent to those of ordinary skill in the art that the SRAM cell of the present type may be disposed on a silicon wafer in a pattern, such as that shown in FIG. 12, having very little unused area. It will also be noted that strips 901, 902, 903, 904, 1104, 1105, 1102 of metallic conductor continue from SRAM cell 1110 to make the necessary connections in neighboring SRAM cells in the vertical and horizontal directions.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various modifications and adaptations may become apparent to those skilled in the relevant arts in view of the foregoing description, when read in conjunction with the accompanying drawings. However, any and all modifications of the teachings of this disclosure will still fall within the scope of the non-limiting embodiments of this invention.

Although described in the context of particular embodiments, it will be apparent to those skilled in the art that a number of modifications and various changes to these teachings may occur. Thus, while the invention has been particularly shown and described with respect to one or more embodiments thereof, it will be understood by those skilled in the art that certain modifications or changes may be made therein without departing from the scope of the invention as set forth above, or from the scope of the claims to follow.

What is claimed is:

1. A method for forming a memory device, said method comprising:

forming a first plurality of semiconductor nanowires for a first, a second, and a third field effect transistor (PET) and a second plurality of semiconductor nanowires for a fourth, a fifth, and a sixth FET on a substrate, said first and second pluralities of semiconductor nanowires being arranged on said substrate with said semiconductor nanowires being oriented substantially perpendicular to said substrate and parallel to one another, wherein said semiconductor nanowires of said six FETs are aligned upstanding along a single straight line in a horizontal direction on said substrate;

forming a plurality of bottom contacts for said semiconductor nanowires on said substrate, each of said semiconductor nanowires having one of said plurality of bottom contacts, the one or more of said semiconductor nanowires of said first plurality for said third FET sharing one of said plurality of bottom contacts with the one or more of said semiconductor nanowires of said second plurality for said fourth FET;

forming a plurality of gate contacts separated in a direction perpendicular to said substrate from said plurality of bottom contacts, each of said semiconductor nanowires of said first and second pluralities having one of said plurality of gate contacts, two or more semiconductor nanowires of said first plurality for said second and third FETs sharing one of said plurality of gate contacts with one another, and two or more semiconductor nanowires of said second plurality for said fourth and fifth FETs sharing another of said plurality of gate contacts with one another;

forming a first top contact for said first plurality of semiconductor nanowires and a second top contact for said second plurality of semiconductor nanowires, said first and second top contacts separated in a direction perpendicular to said substrate from said plurality of gate contacts, whereby said third and fourth FETs share one of said plurality of bottom contacts; said second and third FETs share one of said plurality of gate contacts; said fourth and fifth FETs share another of said plurality of gate contacts; said first, second, and third FETs share the first top contact; and said fourth, fifth, and sixth FETs share the second top contact;

connecting said one of said plurality of gate contacts of said second and third FETs to said second top contact of said fourth, fifth, and sixth FETs;

connecting said another of said plurality of gate contacts of said fourth and fifth FETs to said first top contact of said first, second, and third FETs;

connecting said gate contacts of said plurality of gate contacts of said first and sixth FETs to word line (WL) connections;

connecting said bottom contacts of said plurality of bottom contacts of said second and fifth FETs to voltage source (Vdd) connections;

connecting said bottom contact of said plurality of bottom contacts of said first FET to a second bit line (BLB) connection;

connecting said bottom contact of said plurality of bottom contacts of said sixth FET to a first bit line (BL) connection; and connecting said shared bottom contact of said plurality of bottom contacts of said third and fourth FETs to a ground (Vss) connection.

2. The method as claimed in claim 1, wherein said first and second pluralities of semiconductor nanowires are silicon nanowires.

3. The method as claimed in claim 1, wherein said first FET is an n-type FET (nFET), said second FET is a p-type FET (pFET), said third FET is an nFET, said fourth FET is an nFET, said fifth FET is a pFET, and said sixth FET is an nFET.

4. The method as claimed in claim 1, wherein said first FET is a pass-gate (PG) transistor, said second FET is a pull-up (PU) transistor, said third FET is a pull-down (PD) transistor, said fourth FET is a PD transistor, said fifth FET is a PU transistor, and said sixth FET is a PG transistor.

5. The method as claimed in claim 1, wherein said first, second, fifth, and sixth FETs are each formed by one semiconductor nanowire, and said third and fourth FETs are each formed by two semiconductor nanowires.

6. The method as claimed in claim 1, wherein said second and fifth FETs are each formed by one semiconductor nanowire, and said first, third, fourth, and sixth FETs are each formed by two semiconductor nanowires.

7. The method as claimed in claim 1, wherein said first, second, third, fourth, fifth, and sixth FETs are each formed by one semiconductor nanowire.

8. The method as claimed in claim 1, wherein said one of said plurality of gate contacts of said second and third FETs is connected to said second top contact of said fourth, fifth, and sixth FETs by vias extending substantially perpendicular to said substrate from a first metallization layer separated in a direction perpendicular to said substrate from said first and second top contacts; said another of said plurality of gate contacts of said fourth and fifth FETs is connected to said first top contact of said first, second, and third FETs by vias extending substantially perpendicular to said substrate from said first metallization layer; said gate contacts of said plurality of gate contacts of said first and sixth FETs are connected to word line (WL) connections in said first metallization layer by vias extending from said gate contacts in a direction substantially perpendicular to said substrate to said word line (WL) connections; said bottom contacts of said plurality of bottom contacts of said second and fifth FETs are connected to voltage source (Vdd) connections in said first metallization layer by vias extending from said bottom contacts in a direction substantially perpendicular to said substrate to said voltage source (Vdd) connections; said bottom contact of said first FET is connected to a second bit line (BLB) connection in a second metallization layer separated in a direction perpendicular to said substrate from said first metallization layer by a via extending from said bottom contact in a direction substantially perpendicular to said substrate to said second bit line (BLB) connection; said bottom contact of said sixth FET is connected to a first bit line (BL) connection in said second metallization layer by a via extending from said bottom contact in a direction substantially perpendicular to said substrate to said first bit line (BL) connection; and said shared bottom contact of said plurality of bottom contacts of said third and fourth FETs is connected to a ground (Vss) connection in a third metallization layer separated in a direction perpendicular to said substrate from said second metallization layer by a via extending from said shared bottom contact in a direction substantially perpendicular to said substrate to said ground (Vss) connection.

9. The method as claimed in claim 1, wherein said first FET is formed by more than one of said first plurality of semiconductor nanowires.

10. The method as claimed in claim 1, wherein said third FET is formed by more than one of said first plurality of semiconductor nanowires.

11. The method as claimed in claim 1, wherein said fourth FET is formed by more than one of said second plurality of semiconductor nanowires.

12. The method as claimed in claim 1, wherein said sixth FET is formed by more than one of said second plurality of semiconductor nanowires.

* * * * *